US011024554B2

United States Patent
Kawagoe

(10) Patent No.: US 11,024,554 B2
(45) Date of Patent: Jun. 1, 2021

(54) WIRING SUBSTRATE, ELECTRONIC DEVICE, AND ELECTRONIC MODULE

(71) Applicant: KYOCERA Corporation, Kyoto (JP)

(72) Inventor: Hiroshi Kawagoe, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/487,201

(22) PCT Filed: Feb. 20, 2018

(86) PCT No.: PCT/JP2018/005986
§ 371 (c)(1),
(2) Date: Aug. 20, 2019

(87) PCT Pub. No.: WO2018/155434
PCT Pub. Date: Aug. 30, 2018

(65) Prior Publication Data
US 2019/0378772 A1 Dec. 12, 2019

(30) Foreign Application Priority Data
Feb. 21, 2017 (JP) .............................. JP2017-030073

(51) Int. Cl.
*H01L 23/00* (2006.01)
*H01L 23/13* (2006.01)
(Continued)

(52) U.S. Cl.
CPC ........ *H01L 23/13* (2013.01); *H01L 23/49811* (2013.01); *H01L 23/49838* (2013.01); *H01L 24/16* (2013.01); *H01L 24/48* (2013.01); *H01L 23/49827* (2013.01); *H01L 33/62* (2013.01); *H01L 2224/16227* (2013.01); *H01L 2224/48091* (2013.01); *H01L 2224/48106* (2013.01);
(Continued)

(58) Field of Classification Search
CPC ......... H01L 24/04; H01L 24/05; H01L 24/06; H01L 24/07
See application file for complete search history.

(56) References Cited

U.S. PATENT DOCUMENTS 10,381,294 B2 * 8/2019 Chan .................. H01L 23/06
2008/0105964 A1 * 5/2008 Iwamura .............. H01L 25/105
257/686

(Continued)

FOREIGN PATENT DOCUMENTS

JP   2002-083900 A   3/2002
JP   2005-101095 A   4/2005
(Continued)

*Primary Examiner* — Jae Lee
(74) *Attorney, Agent, or Firm* — Volpe Koenig

(57) ABSTRACT

A wiring substrate includes an insulating substrate being square in plan view, the insulating substrate including one main surface with a recess, and the other main surface opposite to the one main surface, and external electrodes located on the other main surface of the insulating substrate. The external electrodes are arranged in a row in a peripheral section of the insulating substrate. In plan view, an area of one of the external electrodes located at a center of each side of the insulating substrate is larger than an area of one of the external electrodes located at an edge of the each side.

14 Claims, 13 Drawing Sheets

(51) Int. Cl.
*H01L 23/498* (2006.01)
*H01L 33/62* (2010.01)

(52) U.S. Cl.
CPC .............. *H01L 2224/48227* (2013.01); *H01L 2924/15153* (2013.01)

(56) References Cited

U.S. PATENT DOCUMENTS

| | | | |
|---|---|---|---|
| 2013/0189935 A1* | 7/2013 | Nair | H01Q 1/2283 455/90.2 |
| 2013/0301230 A1 | 11/2013 | Aoyama et al. | |
| 2016/0007447 A1 | 1/2016 | Funahashi et al. | |
| 2016/0126153 A1 | 5/2016 | Minegishi | |
| 2016/0254416 A1 | 9/2016 | Cheng | |

FOREIGN PATENT DOCUMENTS

| | | | | |
|---|---|---|---|---|
| JP | 2010-278133 A | 12/2010 | | |
| WO | 2006/106564 A1 | 10/2006 | | |
| WO | 2006/114971 A2 | 11/2006 | | |
| WO | WO2006114971 | * 11/2006 | ... | H01L 2224/16225 |
| WO | 2009-044737 A1 | 4/2009 | | |
| WO | 2014/119729 A1 | 8/2014 | | |

\* cited by examiner

← DIRECTION A

← DIRECTION A

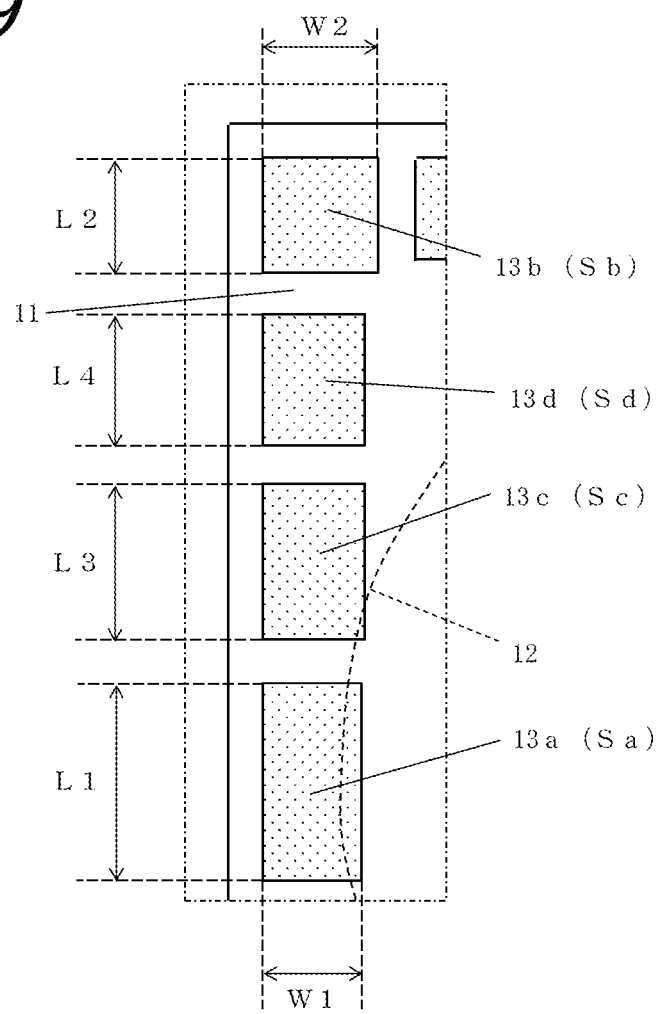
FIG. 9
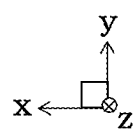

WIRING SUBSTRATE, ELECTRONIC DEVICE, AND ELECTRONIC MODULE

TECHNICAL FIELD

The present invention relates to a wiring substrate, an electronic device, and an electronic module.

BACKGROUND ART

Wiring substrates and electronic devices have been known, in which an electronic component is mounted on a main surface of an insulating substrate made of ceramics (Refer to, Japanese Unexamined Patent Application Publication No. 2005-101095).

In such wiring substrates, the insulating substrate has a recess for accommodating and mounting an electronic component on its upper surface, and external electrodes to be connected to a module substrate on its lower surface.

SUMMARY OF INVENTION

A wiring substrate of the present disclosure includes an insulating substrate that is square in plan view, the insulating substrate including one main surface with a recess, and an other main surface opposite to the one main surface, and external electrodes located on the other main surface of the insulating substrate. The external electrodes are arranged in a row in a peripheral section of the insulating substrate. In plan view, an area of one of the external electrodes located at a center of each side of the insulating substrate is larger than an area of one of the external electrodes located at an edge of the each side.

An electronic device of the present disclosure includes the wiring substrate having the above-mentioned configuration, and an electronic component mounted on the wiring substrate.

An electronic module of the present disclosure includes a module substrate having a connection pad, and the electronic device connected to the connection pad via a solder.

BRIEF DESCRIPTION OF DRAWINGS

FIG. 9 is an enlarged bottom view of a main portion of an A portion of the electronic device in FIG. 8(B).

DESCRIPTION OF EMBODIMENTS

Some exemplary embodiments of the present disclosure will be described below with reference to the appended figures.

First Embodiment

Figure 4:
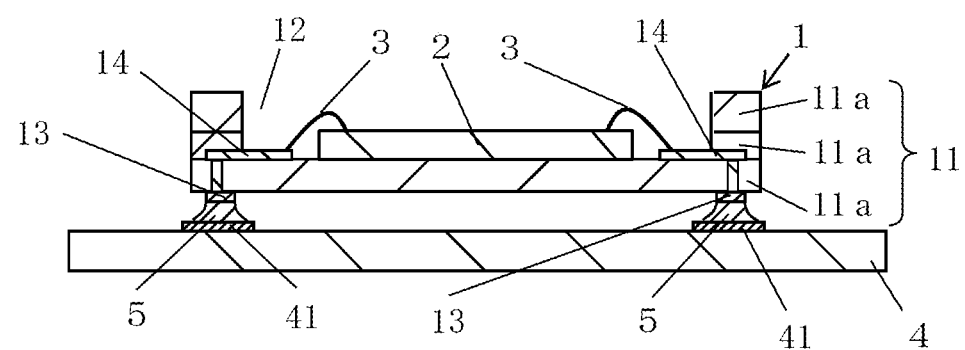
FIG. 4 is a vertical sectional view of an electronic module having a module substrate that mounts the electronic device in FIG. 1 thereon.
Figure 4:
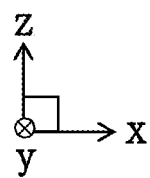

As illustrated in FIGS. 1 to 4, an electronic device in a first embodiment includes a wiring substrate 1 and an electronic component 2 mounted in a recess 12 of the wiring substrate 1. As illustrated in FIG. 4, the electronic device is connected to a module substrate 4 constituting an electronic module by means of solders 5.

The wiring substrate 1 in this embodiment includes a square insulating substrate 11 in plan view having one main surface with a recess 12 and the other main surface opposite to the one main surface, and external electrodes 13 located on the other main surface of the insulating substrate 11. The wiring substrate 1 includes wiring conductors 14 in and on the insulating substrate 11. The external electrodes 13 are arranged in a row in a peripheral section of the insulating substrate 11. In plan view, an area of an external electrode 13a located at the center of each side of the insulating substrate 11 is larger than an area of an external electrode 13b located at an edge of the side. In FIGS. 1 to 4, an upward direction refers to a positive direction along a virtual z axis. In following description, expressions related to upper and lower are used for the sake of convenience, and do not limit to the actual direction in use of the wiring substrate 1 and so on.

Figure 1A:
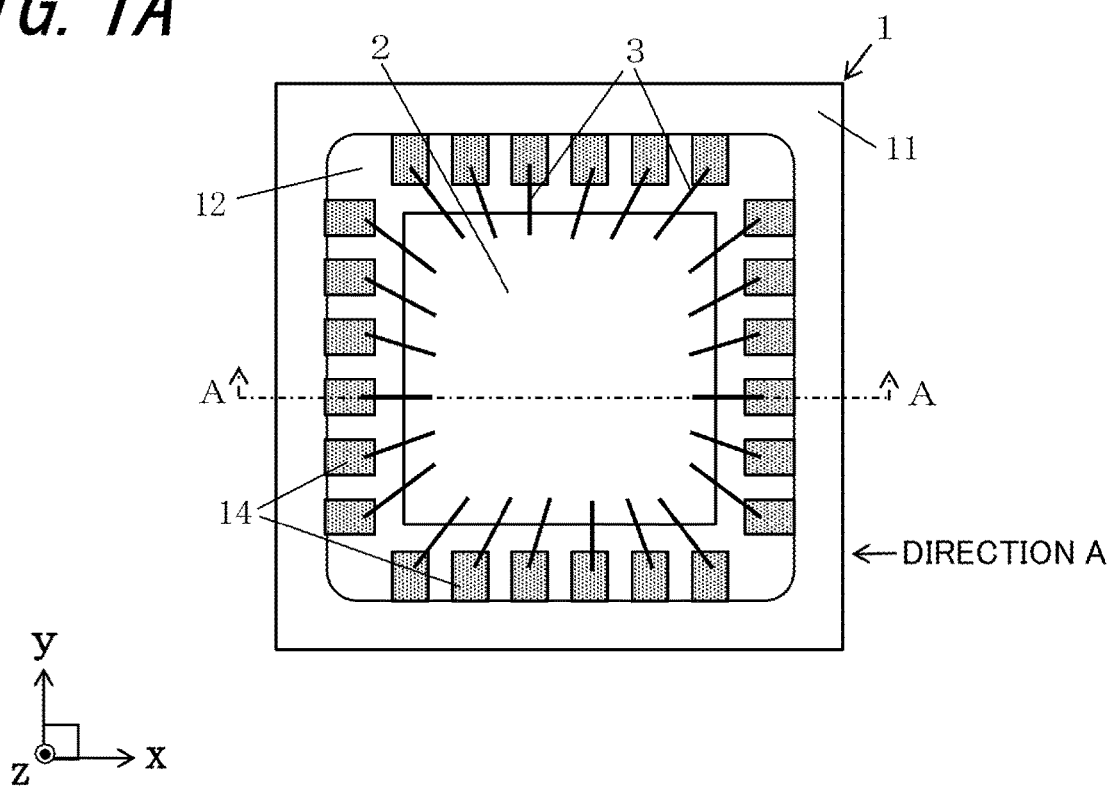
FIG. 1(A) is a top view of an electronic device in a first embodiment.

In the example illustrated in FIG. 1(A), the wiring conductors 14 are shaded. In the example illustrated in FIGS. 1(B), 2, and 3(B), the external electrodes 13 are shaded. In the example illustrated in FIGS. 1(B) and 2, in perspective plan view, an area overlapping with an inner wall of the recess 12 is represented by a dotted line.

The insulating substrate 11 has one main surface (upper face in FIGS. 1 to 4), the other main surface (lower face in FIGS. 1 to 4) opposite to the one main surface, and a side face. The insulating substrate 11 is configured of a plurality of insulating layers 11a, and has the recess 12 that is opened to the one main surface and mounts the electronic component 2 thereon. In plan view, that is, when viewed from the direction perpendicular to the one main surface, the insulating substrate 11 is shaped like a square plate. The insulating substrate 11 functions as a support body for supporting the electronic component 2, and the electronic component 2 is fixedly adhered to a mounting portion of a bottom surface of the recess 12 via connection members 3 such as solder bumps, gold bumps, conductive resins (for example, anisotropic conductive resins), and other resins.

The insulating substrate 11 may be made of ceramic, for example, an aluminum oxide sintered body (alumina ceramics), an aluminum nitride sintered body, a silicon nitride sintered body, a mullite sintered body, or a glass ceramic sintered body. When the insulating substrate 11 is the aluminum oxide sintered body, a suitable organic binder and solvent are added to raw powders such as aluminum oxide ($Al_2O_3$), silicon oxide ($SiO_2$), magnesium oxide (MgO), calcium oxide (CaO), and they are mixed to prepare a slurry. The slurry is shaped into a sheet according to the well-known doctor blade or calendar roll to prepare a ceramic green sheet. Next, the ceramic green sheet is properly punched. A plurality of the punched ceramic green sheets is laminated to form a raw compact, and the raw compact is fired at high temperatures (about 1600 degrees) to produce the insulating substrate 11.

Figure 1B:
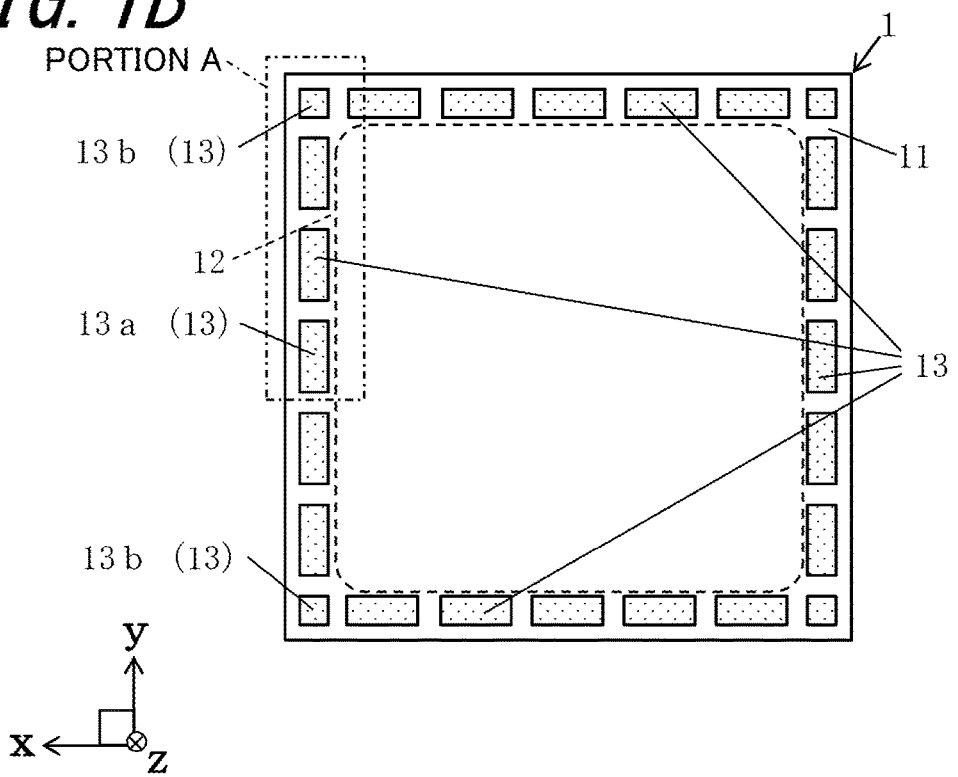
FIG. 1(B) is a bottom view of the electronic device in FIG. 1(A).
Figure 2:
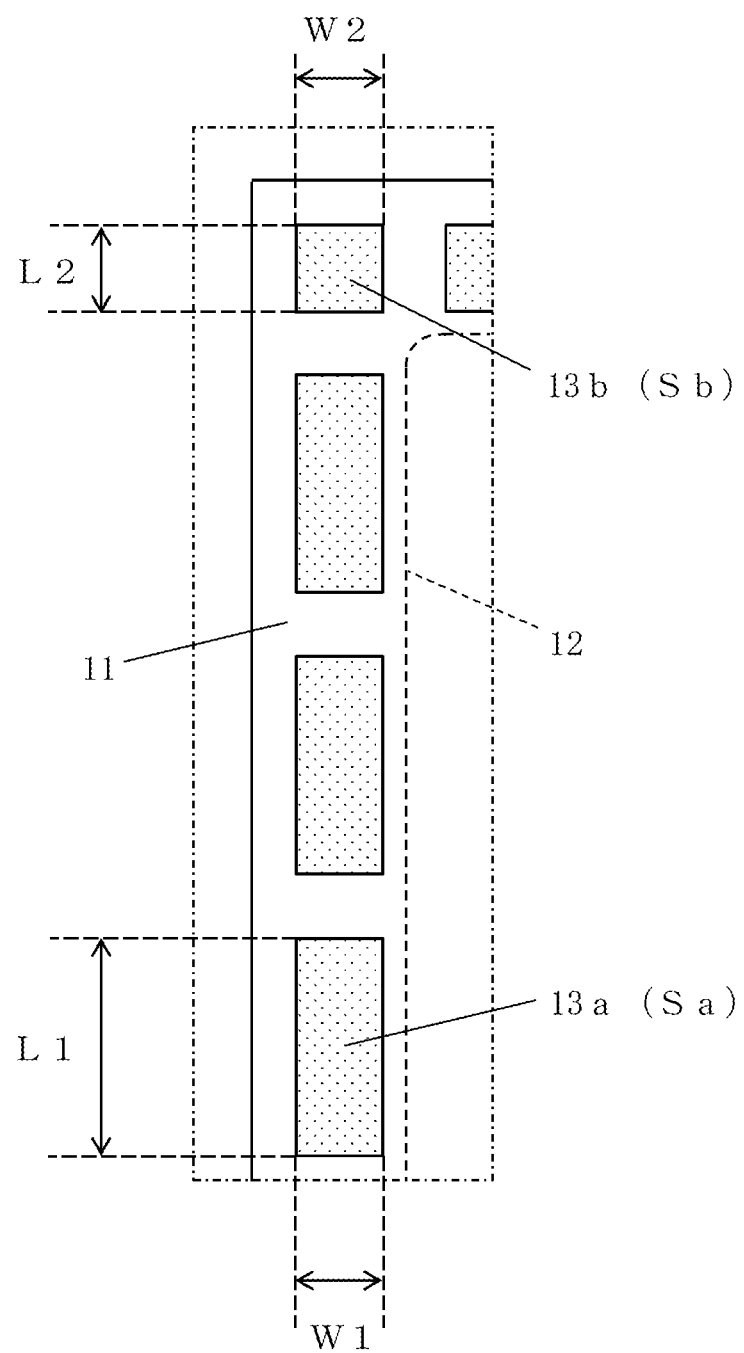
FIG. 2 is an enlarged bottom view of a main portion of an A portion of the electronic device in FIG. 1(B).
Figure 2:
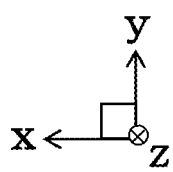
Figure 3A:
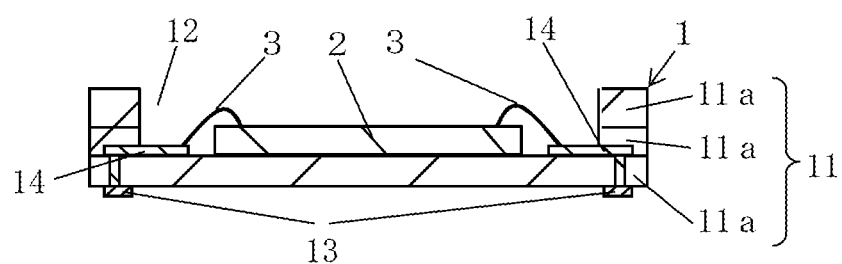
FIG. 3(A) is a vertical sectional view of the electronic device taken along a line A-A in FIG. 1(A)
Figure 3A:
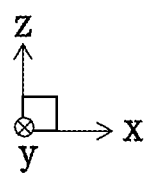
Figure 3B:
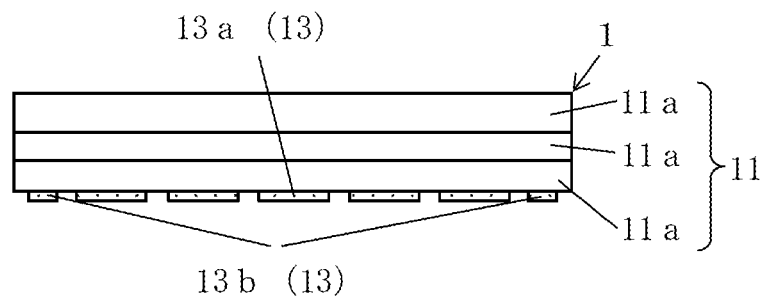
FIG. 3(B) is a side view of the electronic device in FIG. 1(A) in an A direction.
Figure 3B:
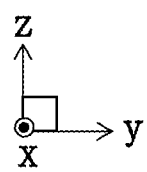

In the example illustrated in FIGS. 1 and 2, the recess 12 is located at the one main surface of the insulating substrate 11. The recess 12 serves to mount the electronic component 2 on the bottom face. In the example illustrated in FIG. 1, the recess 12 is shaped like a square with arc-like corners in plan view, and is located at a center of the insulating substrate 11. In the example illustrated in FIGS. 1 to 3, the insulating substrate 11 is configured of three of the insulating layers 11a, and the recess 12 is provided in the first and second insulating layers 11a from the side of the one main surface.

For example, the recess 12 can be formed by making through holes in some of the ceramic green sheets for the insulating substrate 11 by laser machining, punching with a mold, or the like, and laminating the ceramic green sheets on other ceramic green sheets having no through hole.

The external electrodes 13 and the wiring conductors 14 are located on and in the insulating substrate 11. The external electrodes 13 and the wiring conductors 14 serve to electrically connect the electronic component 2 to the module substrate 4. In the example illustrated in FIGS. 1 to 3, the external electrodes 13 are disposed on the other main surface of the insulating substrate 11. As in the example illustrated in FIGS. 1 to 3, the wiring conductors 14 each include a through conductor for electrically connecting a wiring layer located on the surface of the insulating layer 11a constituting the insulating substrate 11 to wiring layers vertically passing through the insulating layers 11a constituting the insulating substrate 11, or electrically connecting the wiring layer to the external electrode 13. In the example illustrated in FIGS. 1 to 3, the wiring conductors 14 each have one end connected to the bottom surface of the recess 12 and the other end connected to the respective external electrodes 13.

The external electrodes 13 and the wiring conductors 14 are metallized metal powders containing tungsten (W), molybdenum (Mo), manganese (Mn), silver (Ag), or copper (Cu) as a main component. For example, when the insulating substrate 11 is formed of an aluminum oxide sintered body, a metallized paste is acquired by adding a suitable organic binder and solvent to high-melting-point metal powders of W, Mo, Mn or the like and mixing them. Then, the metallized paste is printed onto the ceramic green sheet for the insulating substrate 11 in a predetermined pattern by screen printing, and is fired together with the ceramic green sheet for the insulating substrate 11 to be adhered at predetermined positions of the insulating substrate 11. For example, the external electrodes 13 and the wiring conductors 14 are formed by printing the metallized paste for the external electrodes 13 or the wiring conductors 14 onto the ceramic green sheet for the insulating substrate 11 by printing means such as screen printing, and are fired together with the ceramic green sheet for the insulating substrate 11. For example, the through conductors are formed by making through holes in the ceramic green sheet for the insulating substrate 11 by punching using a mold, laser machining, or any other suitable processing, and filling the metallized paste for the through conductors into the through holes by the above-mentioned printing and then, firing the metallized paste together with the ceramic green sheet for the insulating substrate 11. The metallized paste is prepared by adding a suitable solvent and binder to the above-mentioned metal powders, and kneading them into suitable viscosity. To increase the joining strength with the insulating substrate 11, glass powders or ceramic powders may be contained.

The external electrodes 13 are arranged in a row in the peripheral section of the insulating substrate 11. This means that three or more of the external electrodes 13 are located along one side of the insulating substrate 11. For example, in the example in FIGS. 1 to 3, twenty-four external electrodes 13 are arranged in a row in the peripheral section of the insulating substrate 11. In the example in FIGS. 1 to 3, seven external electrodes 13 are aligned along each side of the insulating substrate 11. The external electrodes 13 are located along the recess 12 in perspective plan view. The external electrode 13a located at the center of each side of the insulating substrate 11 refers to the external electrode 13 closest to the center of each side of the insulating substrate 11, and the external electrodes 13b located at the edges of the side refer to the external electrodes 13 closest to the corners of the insulating substrate 11. When the two external electrodes 13 are symmetrically located across the center of each side of the insulating substrate 11, each of the two external electrodes 13 may be the external electrode 13a located at the center of the insulating substrate 11.

As in the example in FIGS. 1 and 2, an area Sa of the external electrode 13a located at the center of each side of the insulating substrate 11 is larger than an area Sb of the external electrode 13b located at the edge of each side (Sa>Sb). The area Sa of the external electrode 13a located at the center of each side of the insulating substrate 11 is 1.05 to 3.00 times as large as the area Sb of the external electrode 13b located at the edge of each side (1.05 Sb≤Sa≤3.00 Sb).

As in the example in FIG. 2, given that the external electrode 13a located at the center of each side of the insulating substrate 11 has a length L1 and a width W1, and the external electrode 13b located at the edge of each side has a length L2 and a width W2 in the external electrodes 13, in the example in FIGS. 1 to 3, by setting L1 to be larger than L2 and W1 to be equal to W2, Sa is larger than Sb.

A metal plating layer is adhered to each of exposed surfaces of the external electrodes 13 and the wiring conductors 14 on the insulating substrate 11 by electroplating or electroless plating. The metal plating layer is made of metal having good corrosion resistance and connectivity to connection member, for example, nickel, copper, gold, or silver. For example, a nickel plating layer having a thickness in the range of about 0.5 to 5 μm and a gold plating layer having a thickness in the range of about 0.1 to 3 μm are sequentially adhered. This can effectively suppress corrosion of the external electrodes 13 and the wiring conductors 14, and strengthen the bonding between the electronic component 2 and the wiring conductor 14, the bonding between the wiring conductor 14 and the connection member 3 such as a bonding wire, and the bonding between the external electrode 13 and a connection pad 41 disposed on the module substrate 4.

The metal plating layer is not limited to the nickel plating layer/gold plating layer, and may be other metal plating layers including nickel plating layer/palladium plating layer/gold plating layer.

The electronic component 2 may be mounted on the bottom surface of the recess 12 of the wiring substrate 1 to produce the electronic device. Examples of the electronic component 2 mounted on the wiring substrate 1 include: semiconductor elements such as IC chips and LSI chips; light-emitting elements; piezoelectric elements such as quartz oscillators and piezoelectric vibrators; and various sensors. For example, when the electronic component 2 is a wire bonding-type semiconductor element, the semiconductor element is fixed to the bottom surface of the recess 12 using a bonding member such as a low-melting-point brazing material or conductive resin. Then, electrodes of the semiconductor element are electrically connected to the respective wiring conductors 14 via the connection members 3 such as bonding wires. As a result, the electronic component 2 is mounted on the wiring substrate 1. In this manner, the electronic component 2 is electrically connected to the wiring conductors 14. For example, when the electronic component 2 is a flip chip-type semiconductor element, the semiconductor element is mounted on the wiring substrate 1 by electrically and mechanically connecting electrodes of the semiconductor element to the respective wiring conductors 14 via the connection members 3 such as solder bumps, gold bumps, or conductive resins (ex. anisotropic conductive resins). The plurality of electronic components 2, or as needed, a small electronic component such as a resistance element or a capacitive element may be mounted on the bottom surface of the recess 12 of the wiring substrate 1. As needed, the electronic component 2 is encapsulated with an encapsulation member such as resin or glass, or that is sealed with a lid made of resin, glass, ceramic, or metal.

For example, as illustrated in FIG. 4, the external electrodes 13 of the electronic device in this embodiment are connected to the respective connection pads 41 of the module substrate 4 via the solders 5 to constitute an electronic module. For example, as illustrated in FIG. 4, in the electronic device, the external electrodes 13 disposed on the other main surface of the wiring substrate 1 are connected to the respective connection pads 41 of the module substrate 4.

The wiring substrate 1 in this embodiment includes the square insulating substrate 11 in plan view having one main surface with the recess 12 and the other main surface opposite to the one main surface, and the external electrodes 13 located on the other main surface of the insulating substrate 11. The external electrodes 13 are arranged in a row in the peripheral section of the insulating substrate 11. In plan view, the area of the external electrode 13a located at the center of each side of the insulating substrate 11 is larger than the area of the external electrode 13b located at the edge of the side. With the above-mentioned configuration, in plan view, by increasing the area of the external electrode 13a located at the center, which easily and largely deforms, of each side of the insulating substrate 11, for example, when the electronic device including the wiring substrate 1 is connected to the module substrate 4 via the solders 5, the external electrodes 13a having large areas, which are connected via the solders 5 and located at the center of sides of the insulating substrate 11, can hold the peripheries of the side walls of the recess 12, thereby suppressing the deformation of the side wall of the recess 12 located at the center of each side of the insulating substrate 11, in turn, the degradation of airtightness in the recess 12.

For example, when the recess 12 is encapsulated with an encapsulation member such as resin or glass, the encapsulation member can be suppressed from falling out of the recess 12, and when the recess 12 is sealed with a lid made of resin, glass, ceramics, or metal, the cover can be suppressed from being taken off the upper surface of the side wall of the recess 12.

As in the example in FIGS. 1 to 3, given that the area of the external electrode 13a located at the center of each side of the insulating substrate 11 is larger than the area of the two external electrodes 13b located at the edges of each side in the external electrodes 13, for example, when the electronic device including the wiring substrate 1 is connected to the module substrate 4 via the solders 5, the external electrode 13a having large are, which is connected via the solder 5, located at the center of each side of the insulating substrate 11, and interposed between the external electrodes 13b located at the edges of each side, can hold the periphery of the side wall of the recess 12 in the center of each side of the insulating substrate 11 in a well-balanced manner, thereby suppressing the deformation of the side wall of the recess 12 located at the center of each side of the insulating substrate 11, in turn, the degradation of airtightness in the recess 12.

As in the example in FIG. 1(B), providing that, on each of two opposed sides of the insulating substrate 11, the area of the external electrode 13a located at the center of each side of the insulating substrate 11 is larger than the area of each of the external electrodes 13b located at the edges of each side in the external electrodes 13, for example, when the electronic device including the wiring substrate 1 is connected to the module substrate 4 via the solders 5, the external electrodes 13a having large areas, which are connected via the solders 5 and located at the center of the two opposed sides of the insulating substrate 11, can hold the peripheries of the side walls of the recess 12 in better-balanced manner, thereby suppressing the deformation of the side wall of the recess 12 located at the center of each side of the insulating substrate 11, in turn, the degradation of airtightness in the recess 12.

As in the example in FIG. 1(B), providing that, on each of four sides of the insulating substrate 11, the area of the external electrode 13a located at the center of each side of the insulating substrate 11 is larger than the area of each of the external electrodes 13b located at the edges of each side in the external electrodes 13, for example, when the electronic device including the wiring substrate 1 is connected to the module substrate 4 via the solders 5, the external electrodes 13a having large areas, which are connected via the solders 5 and located at the center of the four sides, that is, the entire outer edge, of the insulating substrate 11, can effectively hold the peripheries of the side walls of the recess 12 in better-balanced manner, thereby suppressing the deformation of the side wall of the recess 12 located at the center of each side of the insulating substrate 11, in turn, the degradation of airtightness in the recess 12.

As illustrated in FIGS. 1 to 3, providing that the external electrodes 13 are arranged into a band-shape, the external electrode 13a having large area and located at the center of each side of the insulating substrate 11 is located along the side at the center of each side of the insulating substrate 11. For example, when the electronic device including the wiring substrate 1 is connected to the module substrate 4 via the solders 5, the external electrode 13a having large area, which is located at the center of each side of the insulating substrate 11 and connected via the solder 5 can hold the center of each side of the insulating substrate 11 along the side in the periphery of the side wall of the recess 12, thereby suitably suppressing the deformation of the side wall of the recess 12, in turn, the degradation of airtightness in the recess 12.

Providing that the recess 12 is square in plan view, for example, when the electronic device including the wiring substrate 1 is connected to the module substrate 4 via the solders 5, by increasing the area of the external electrode 13a that is connected via the solder 5 and located at the center, which is easily and largely deforms, of each side of the insulating substrate 11 in plan view, the external electrode 13a located at the center of the side (side wall) of the recess 12 can hold the center of the side (side wall) of the square recess 12, thereby suppressing the deformation of the side wall of the square recess 12 located at the center of the side of the insulating substrate 11, in turn, the degradation of airtightness in the recess 12.

The square recess 12 includes the rectangular recess 12 having arc-like corners as in the example illustrated in FIG. 1(A), and the rectangular recess 12 having notches at corners or sides.

The electronic device in this embodiment includes the wiring substrate 1 having the above-mentioned configuration, and the electronic component 2 mounted on the wiring substrate 1, achieving good airtightness and long-term reliability.

The electronic module in this embodiment includes the module substrate 4 having the connection pads 41, and the electronic device having the above-mentioned configuration and connected to the connection pads 41 via the solders 5, achieving good long-term reliability.

The wiring substrate 1 in this embodiment may be suitably used in a compact and high-output electronic device, and enhance airtightness of the recess 12 in the wiring substrate 1. For example, when a light-emitting element such as LED or LD is mounted as the electronic component 2 on the bottom surface of the recess 12, the wiring substrate 1 may be suitably used as a wiring substrate 1 for a slim and high-luminance light-emission device.

Second Embodiment

Figure 5A:
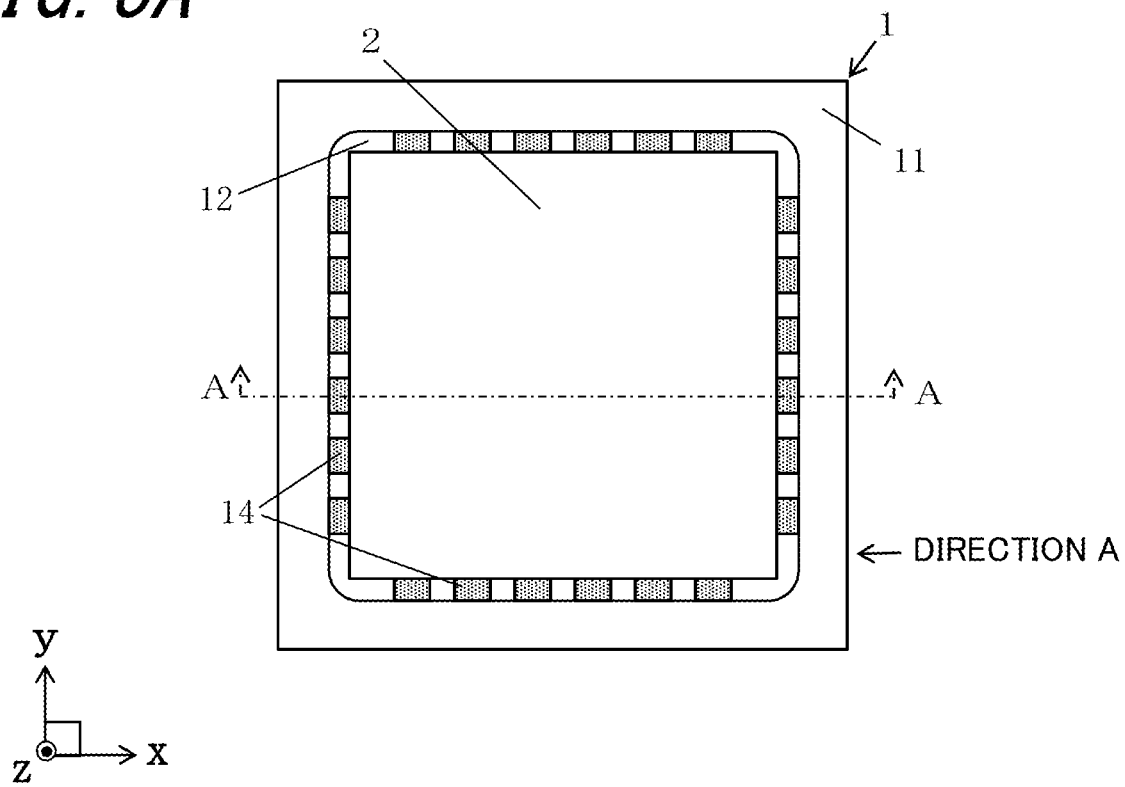
FIG. 5(A) is a top view of an electronic device in a second embodiment.
Figure 5B:
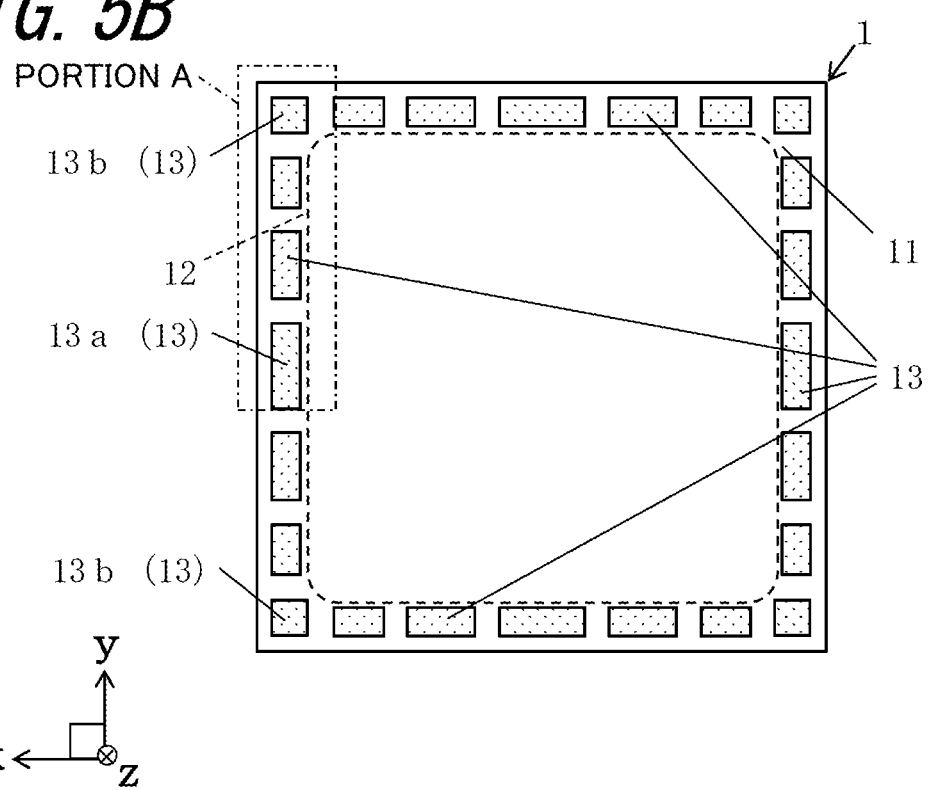
FIG. 5(B) is a bottom view of the electronic device in FIG. 5(A).

Next, an electronic device in a second embodiment will be described below with reference to FIGS. 5 to 7.

The electronic device in the second embodiment is different from the electronic device in the first embodiment in that the areas of external electrodes 13 become gradually larger from the edges toward the center of each side of the insulating substrate 11. As in the example in FIG. 5(A), the wiring conductors 14 are shaded. In the example in FIGS. 5(B), 6, 7(B), the external electrodes 13 are shaded. In the example in FIGS. 5(B) and 6, in perspective plan view, an area overlapping with an inner wall of the recess 12 is represented by a dotted line.

In the wiring substrate 1 in the second embodiment, like the wiring substrate 1 in the first embodiment, for example, when the electronic device including the wiring substrate 1 is connected to the module substrate 4 via the solders 5, the external electrode 13a having large area, which is located at the center of each side of the insulating substrate 11 and connected via the solder 5, can hold the periphery of the side wall of the recess 12, thereby suitably suppressing the deformation of the side wall of the recess 12 located at the center of each side of the insulating substrate 11, in turn, the degradation of airtightness in the recess 12.

For example, when the electronic device including the wiring substrate 1 is connected to the module substrate 4 via the solders 5, by gradually increasing the holding force of the external electrodes 13 connected via the solders 5 from the edges toward the center of each side of the insulating substrate 11 in the periphery of the side wall of the recess 12, it is possible to effectively suppress the deformation amount from gradually increasing from the edges toward the center of each side of the insulating substrate 11, thereby suppressing the degradation of airtightness in the recess 12. Further, a difference in holding force between adjacent external electrodes 13 can be prevented from becoming large.

Figure 6:
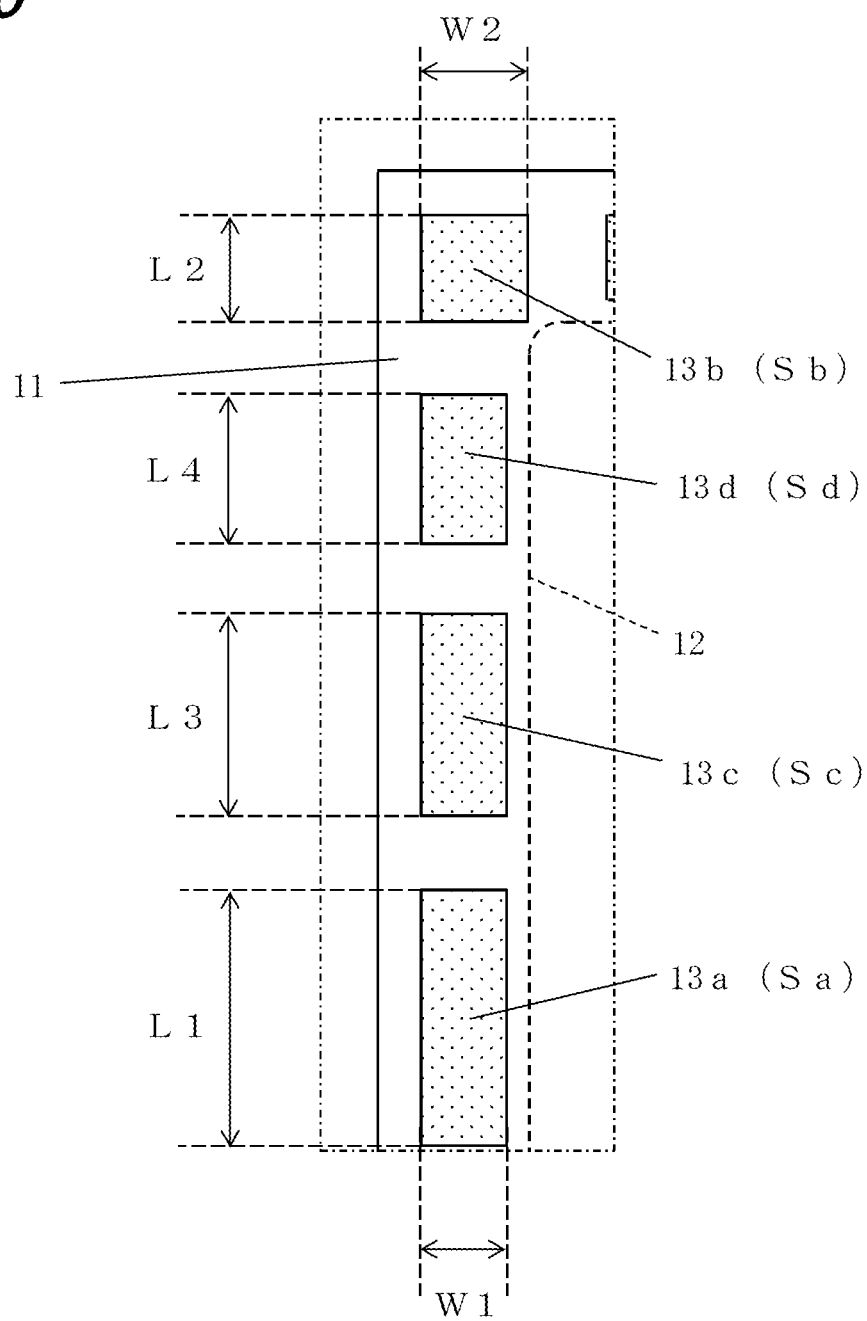
FIG. 6 is an enlarged bottom view of a main portion of an A portion of the electronic device in FIG. 5(B).
Figure 7A:
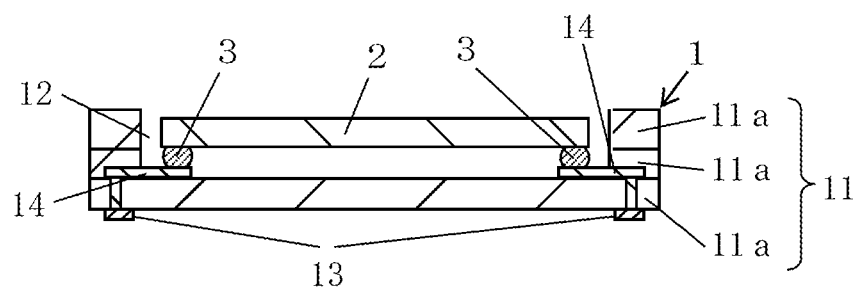
FIG. 7(A) is a vertical sectional view of the electronic device taken along a line A-A in FIG. 5(A)
Figure 7A:
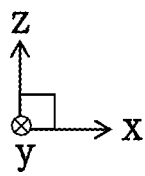
Figure 7B:
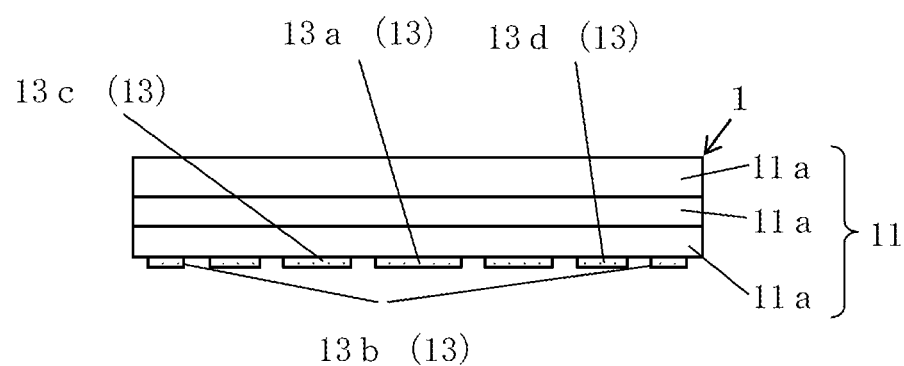
FIG. 7(B) is a side view of the electronic device in FIG. 5(A) in an A direction.
Figure 7B:
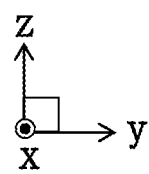

In the example in FIGS. 5 to 7, as in the wiring substrate 1 in the first embodiment, the external electrodes 13 are located along the recess 12 in perspective plan view. In the example in FIGS. 5 to 7, seven external electrodes 13 are aligned along each side of the insulating substrate 11. When two external electrodes 13 are located across the center of the side of the insulating substrate 11, the external electrodes may become gradually larger from the external electrode 13b located at the edge of each side of the insulating substrate 11 toward the external electrode 13a that is located at the center of the side and closer to the edge than the center of the side.

In the example in FIGS. 5 to 7, the external electrodes 13 includes external electrodes 13c and external electrodes 13d between the external electrode 13a located at the center of each side of the insulating substrate 11 and the external electrodes 13b located at the edges of the side. In the example in FIGS. 5 to 7, the external electrodes 13 are arranged from the center to the edge of each side of the insulating substrate 11, that is, in the order of the external electrode 13a, the external electrode 13c, the external electrode 13d, and the external electrode 13b. In plan view, given that the area of external electrode 13c is Sc, and the area of external electrode 13d is Sd, Sa>Sc>Sd>Sb is satisfied. In the wiring substrate 1 in the second embodiment, like the wiring substrate 1 in the first embodiment, the area Sa of the external electrode 13a located at the center of each side of the insulating substrate 11 may be 1.05 to 3.00 times as large as the area Sb of the external electrode 13b located at the edge of each side (1.05 Sb≤Sa≤3.00 Sb). When the areas of the external electrodes 13 become gradually larger from the edge toward the center of each side of the insulating substrate 11, the difference in area ratio between the adjacent external electrodes 13 is preferably 20% or less. For example, in the example illustrated in FIGS. 5 to 7, the difference between Sd/Sb, Sc/Sd, and Sa/Sc each may be 20% or less.

As in the example in FIGS. 5 to 7, the width of the insulating substrate 11 of the external electrodes 13 may be varied (W1≠W2). In the example in FIG. 6, the external electrode 13a located at the center of each side of the insulating substrate 11 has a length L1 and a width W1, the external electrodes 13c each have a length L3 and the width W1, the external electrodes 13d each have a length L4 and the width W1, each of the external electrodes 13b located at the edges of each side has a length L2 and a width W2. In the example in FIGS. 6 to 8, L1>L3>L4>L2, W1≠W2, Sa>Sc>Sd>Sb are satisfied.

Providing that the areas of the external electrodes 13 become gradually larger from two external electrodes 13b located at the edges of each side of the insulating substrate 11 toward the external electrode 13a located at the center of each side, for example, when the electronic device including the wiring substrate 1 is connected to the module substrate 4 via the solders 5, the external electrodes 13 connected via the solders 5 can suppress a difference in holding force between the adjacent external electrodes from becoming large, and effectively hold the periphery of the side wall of the recess 12 along each side of the insulating substrate 11 in a well-balanced manner, thereby effectively suppressing the deformation of the side wall of the recess 12, in turn, the degradation of airtightness in the recess 12.

Providing that, on each of two opposed sides of the insulating substrate 11, the areas of external electrodes 13 become gradually larger from the edges toward the center of the insulating substrate 11, for example, when the electronic device including the wiring substrate 1 is connected to the module substrate 4 via the solders 5, the external electrodes 13 connected via the solders 5 can suppress a difference in holding force between the adjacent external electrodes from becoming large, and on the two opposed sides of the insulating substrate 11, more effectively hold the side walls of the recess 12 along sides of the insulating substrate 11 in a well-balanced manner, thereby suppressing the deformation of the side wall of the recess 12 more effectively, in turn, the degradation of airtightness in the recess 12.

Providing that the areas of the external electrodes 13 become gradually larger from the edges toward the center of each of four sides of the insulating substrate 11, for example, when the electronic device including the wiring substrate 1 is connected to the module substrate 4 via the solders 5, the external electrodes 13 connected via the solders 5 can suppress a difference in holding force between the adjacent external electrodes from becoming large, and on the four sides, that is, the entire outer edge of the insulating substrate 11, hold the peripheries of the side walls of the recess 12 along sides of the insulating substrate 11 in a well-balanced manner more effectively, thereby more effectively suppressing the deformation of the side wall of the recess 12 located at the center of each side of the insulating substrate 11, in turn, the degradation of airtightness in the recess 12.

As illustrated in FIGS. 5 to 7, providing that the external electrodes 13 are arranged into a band-shape, the external electrodes 13 are located along each side of the insulating substrate 11. Thus, for example, when the electronic device including the wiring substrate 1 is connected to the module substrate 4 via the solders 5, the external electrodes 13 connected via the solders 5 can hold the periphery of the side wall of the recess 12 along each side of the insulating substrate 11, thereby suitably suppressing the deformation of the side wall of the recess 12, in turn, the degradation of airtightness in the recess 12.

The wiring substrate 1 in the second embodiment can be manufactured in the similar manner to the wiring substrates 1 in the above-mentioned embodiment.

Third Embodiment

Figure 8A:
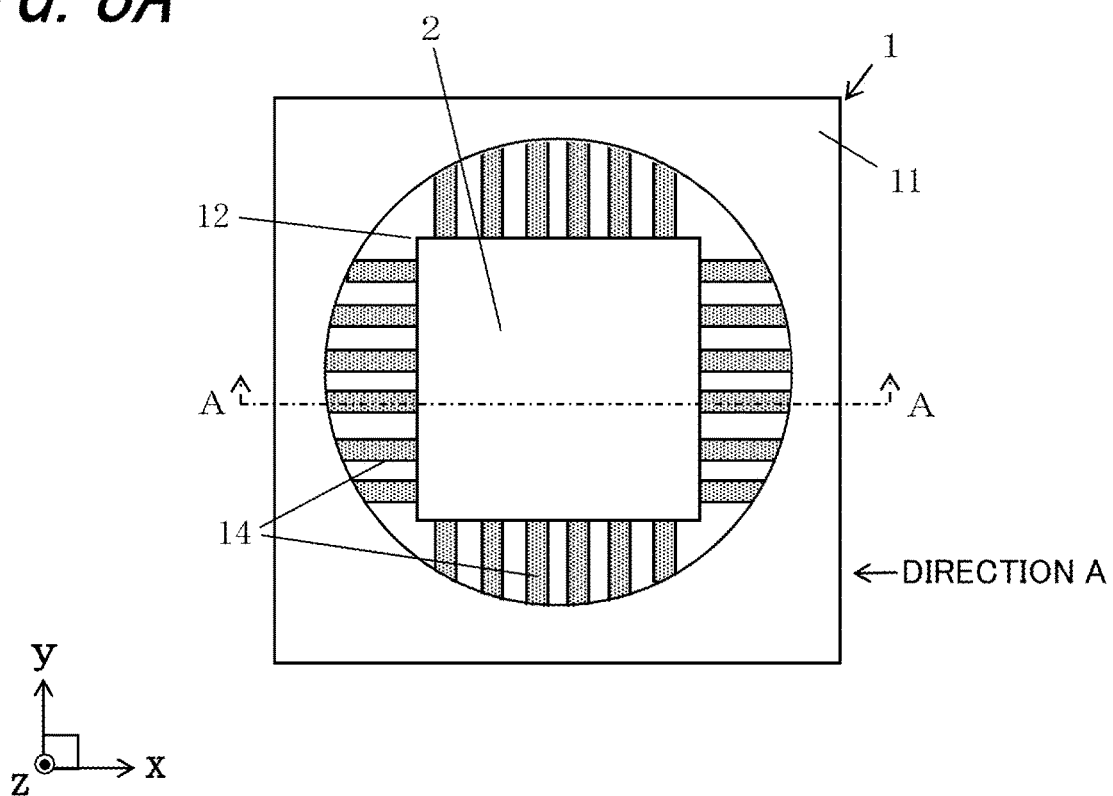
FIG. 8(A) is a top view of an electronic device in a third embodiment.
Figure 8B:
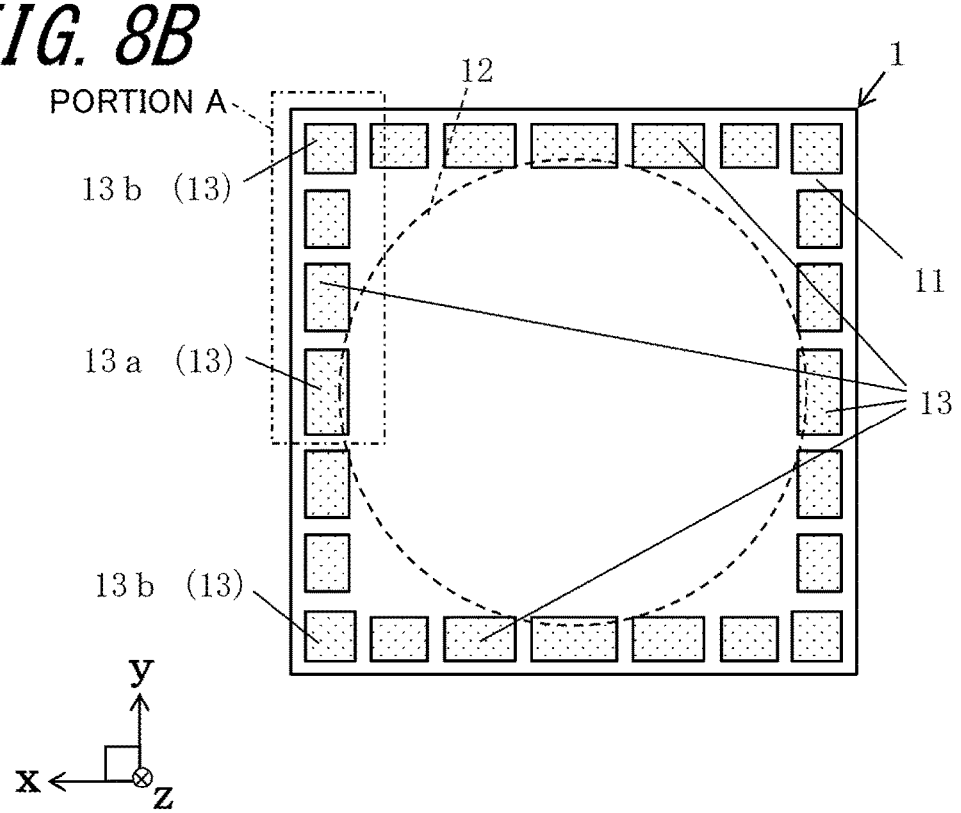
FIG. 8(B) is a bottom view of the electronic device in FIG. 8(A).
Figure 10A:
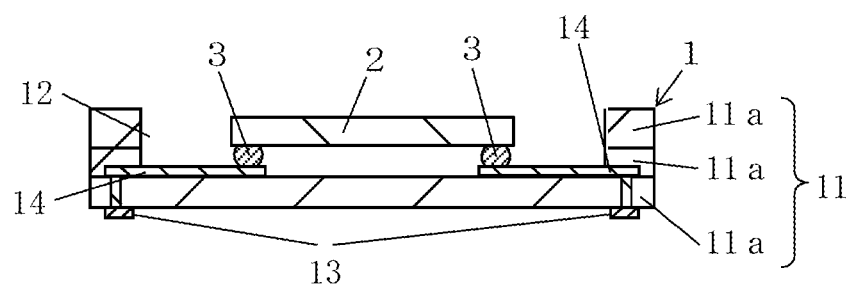
FIG. 10(A) is a vertical sectional view of the electronic device taken along a line A-A in FIG. 8(A)
Figure 10A:
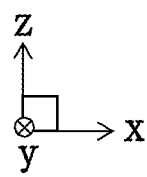
Figure 10B:
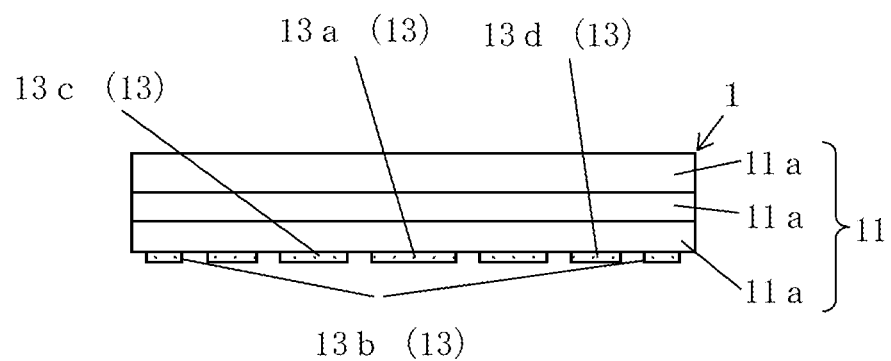
FIG. 10(B) is a side view of the electronic device in FIG. 8(A) in an A direction.
Figure 10B:
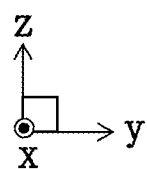

Next, an electronic device in a third embodiment will be described below with reference to FIGS. 8 to 10. The electronic device in the third embodiment is different from the electronic devices in the above-mentioned embodiments in that the recess 12 is circular in plan view. In the example in FIGS. 8 to 10, in the wiring substrate 1 in the third embodiment, like the wiring substrate 1 in the second embodiment, the areas of external electrodes 13 become gradually larger from the edges toward the center of each side of the insulating substrate 11. In the example in FIG. 8(A), the wiring conductors 14 are shaded. In the example in FIGS. 8(B), 9, and 10(B), the external electrodes 13 are shaded. In the example in FIGS. 8(B) and 9, in perspective plan view, an area overlapping with an inner wall of the recess 12 is represented by a dotted line.

In the wiring substrate 1 in the third embodiment, like the wiring substrate 1 in the first embodiment, for example, when the electronic device including the wiring substrate 1 is connected to the module substrate 4 via the solders 5, the external electrode 13a having large area, which is connected via the solder 5 and located at the center of each side of the insulating substrate 11 can hold the periphery of the side wall of the recess 12, thereby suppressing the deformation of the side wall of the recess 12 located at the center of each side of the insulating substrate 11, in turn, the degradation of airtightness in the recess 12.

For example, when the electronic device including the wiring substrate 1 is connected to the module substrate 4 via the solders 5, the area of the external electrode 13a located at the center, having the smallest width of the side wall, of each side of the insulating substrate 11 in plan view can be made largest, among the external electrodes 13 that are connected via the solders 5 and arranged from the edges toward the center of each side of the insulating substrate 11. Accordingly, the deformation of the side wall of the recess 12 located at the center of each side of the insulating substrate 11, and the degradation of airtightness in the recess 12 can be effectively suppressed.

In the example in FIGS. 8 to 10, seven external electrodes 13 on the wiring substrate 1 in the third embodiment are aligned along each side of the insulating substrate 11. Similar to the wiring substrate 1 in the second embodiment, as the external electrodes 13 in the example in FIG. 9, the external electrode 13a located at the center of each side of the insulating substrate 11 has a length L1 and a width W1, the external electrodes 13c each have a length L3 and the width W1, the external electrodes 13d each have a length L4 and the width W1, and each of the external electrodes 13b located at the edges of each side has a length L2 and a width W2. In the example in FIGS. 8 to 10, L1>L3>L4>L2, W1≠W2, Sa>Sc>Sd>Sb are satisfied.

Also, in the wiring substrate 1 in the third embodiment, the external electrodes 13 may be configured on two opposed sides of the insulating substrate 11, and on four sides of the insulating substrate 11, that is, the entire outer edge of the insulating substrate 11, in the similar configuration to the wiring substrate 1 in the first embodiment or the wiring substrate 1 in the second embodiment.

Also, in the wiring substrate 1 in the third embodiment, like the wiring substrate 1 in the first embodiment or the wiring substrate 2 in the second embodiment, the external electrodes 13 may be arranged into a band-shape.

The wiring substrate 1 in the third embodiment can be manufactured in the similar manner to the wiring substrates 1 in the above-mentioned embodiments.

Fourth Embodiment

Figure 11A:
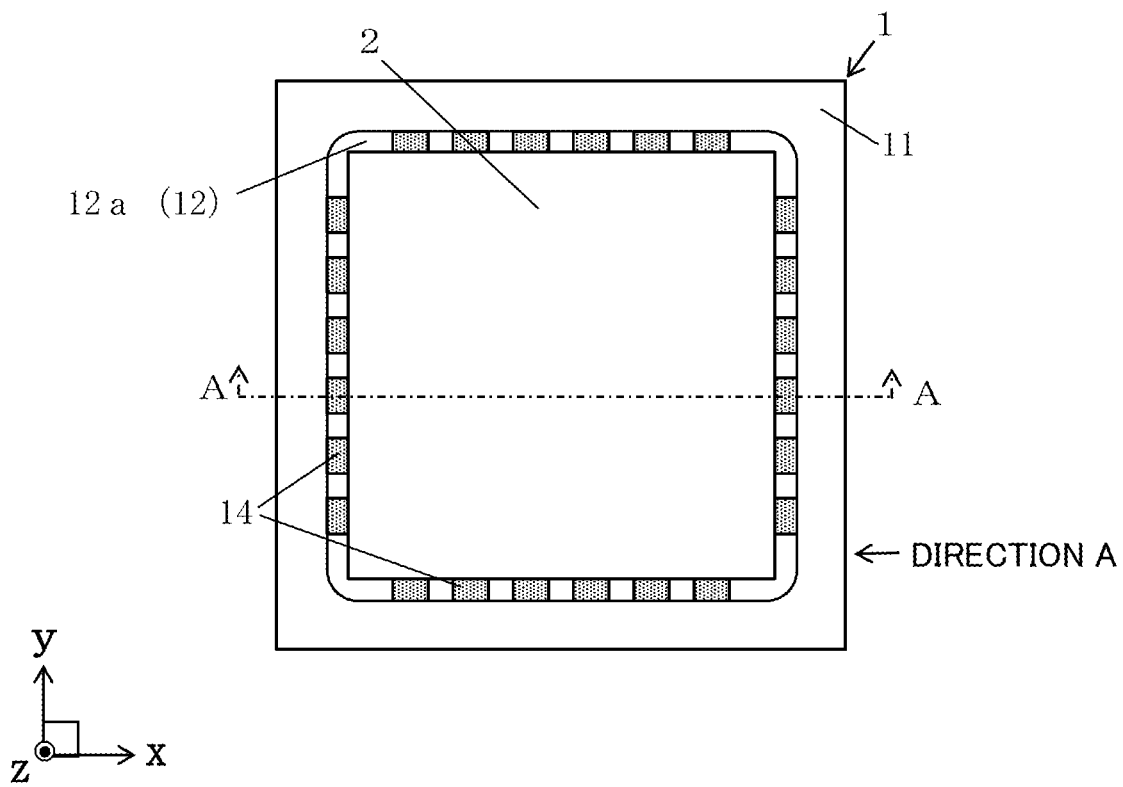
FIG. 11(A) is a top view of an electronic device in a fourth embodiment.
Figure 11B:
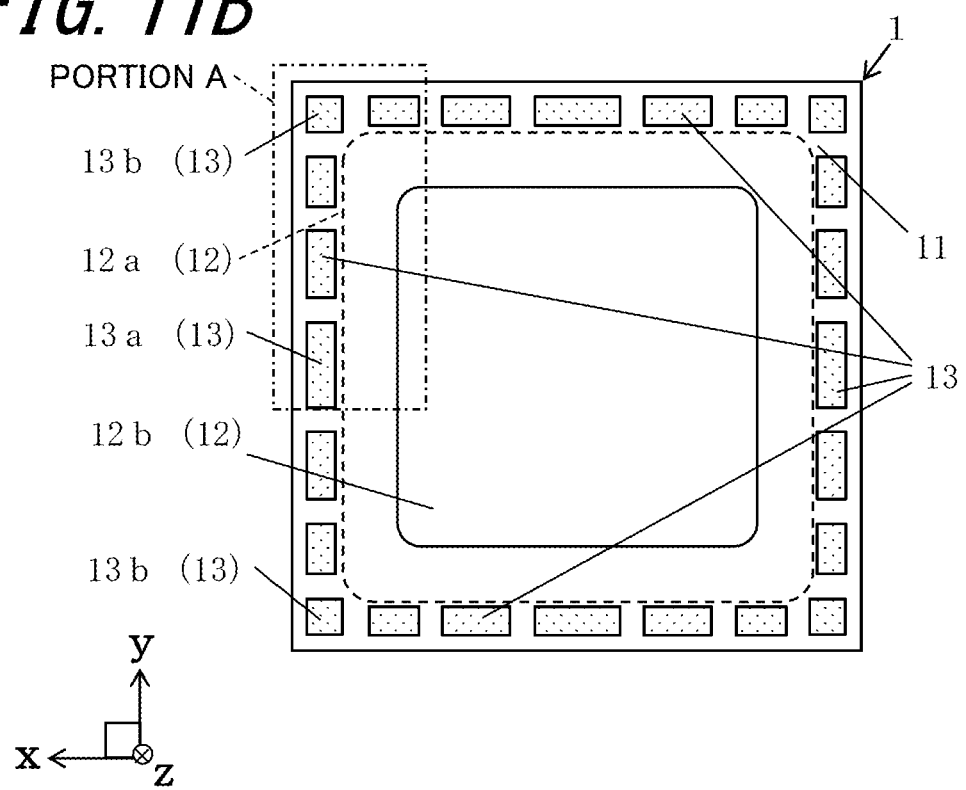
FIG. 11(B) is a bottom view of the electronic device in FIG. 11(A).
Figure 12:
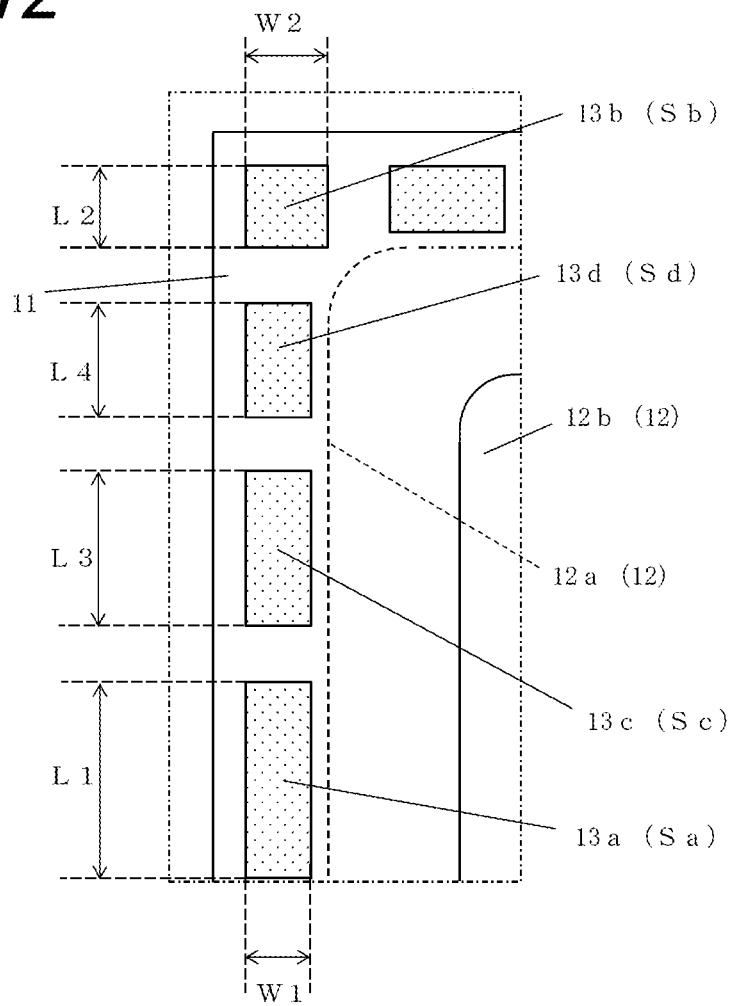
FIG. 12 is an enlarged bottom view of a main portion of an A portion of the electronic device in FIG. 11(B).
Figure 13A:
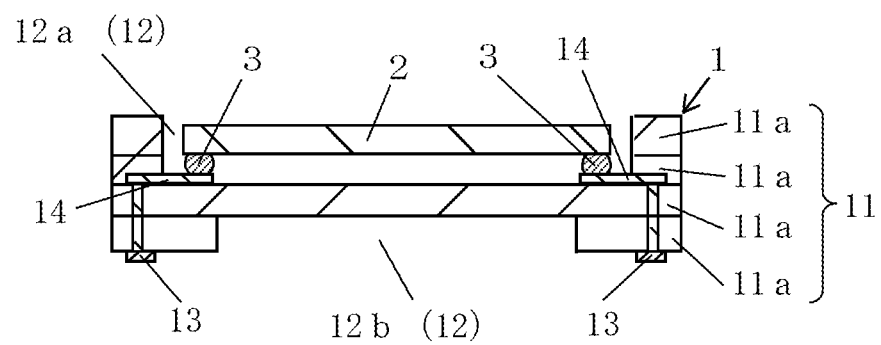
FIG. 13(A) is a vertical sectional view of the electronic device taken along a line A-A in FIG. 11(A)
Figure 13A:
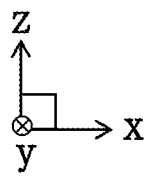
Figure 13B:
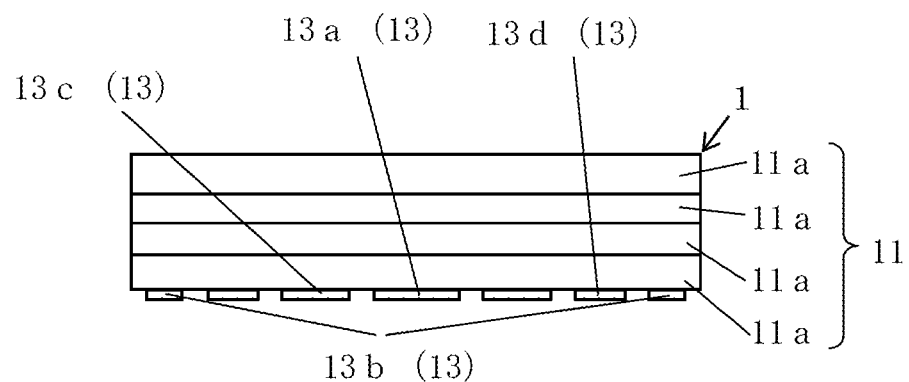
FIG. 13(B) is a side view of the electronic device in FIG. 11(A) in an A direction.
Figure 13B:
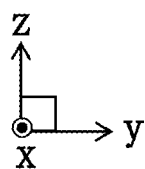

Next, an electronic device in a fourth embodiment will be described below with reference to FIGS. 11 to 13. The electronic device in the fourth embodiment is different from the electronic devices in the above-mentioned embodiments in that the insulating substrate 11 has a first recess 12a on one main surface (upper surface in FIGS. 11 to 13) of the insulating substrate 11 and a second recess 12b on the other main surface (lower surface in FIGS. 11 to 13) opposite to the one main surface of the insulating substrate 11, that is, recesses 12 are located at both main surfaces of the insulating substrate 11. In the example in FIGS. 11 to 13, in the wiring substrate 1 in the fourth embodiment, like the wiring substrate 1 in the second embodiment, the areas of external electrodes 13 become gradually larger from the edges to the center of each side of the insulating substrate 11, and the external electrodes 13 are located along the first recess 12a and the second recess 12b in perspective plan view. In the example in FIG. 11(A), the wiring conductors 14 are shaded. In the example in FIGS. 11(B), 12, and 13(B), the external electrodes 13 are shaded. As illustrated in FIGS. 11(B) and 12, in perspective plan view, an area overlapping with an inner wall of the first recess 12a is represented by a dotted line.

In the wiring substrate 1 in the fourth embodiment, like the wiring substrate 1 in the first embodiment, for example, when the electronic device including the wiring substrate 1 is connected to the module substrate 4 via the solders 5, the external electrode 13a having large area, which is connected via the solder 5 and located at the center of each side of the insulating substrate 11 can hold the periphery of the side wall of the first recess 12a, thereby suppressing the deformation of the side wall of the first recess 12a located at the center of each side of the insulating substrate 11, in turn, the degradation of airtightness in the first recess 12a.

Providing that the area of the second recess 12b located on the other main surface of the insulating substrate 11 is larger than the first recess 12a located on the one main surface of the insulating substrate 11 in perspective plan view, for example, when the electronic device including the wiring substrate 1 is connected to the module substrate 4 via the solders 5, the external electrodes 13 that are connected via the solders 5 and located on the other main surface can hold the peripheries of the side walls of the first recess 12a, thereby suppressing the deformation of the side wall of the first recess 12a located at the center of each side of the insulating substrate 11, in turn, the degradation of airtightness in the first recess 12a.

In the wiring substrate 1 in the fourth embodiment, the insulating substrate 11 is formed of four insulating layers 11a. The first recess 12a is provided in the first and second insulating layers 11a from the one main surface. The second recess 12b is provided in the fourth insulating layers 11a from the one main surface, that is, in the insulating layer 11a on the other main surface opposite to the one main surface. Such first recess 12a and second recess 12b may be manufactured in the similar manner to the recess 12.

In the example in FIGS. 11 to 13, seven external electrodes 13 of the wiring substrate 1 in the fourth embodiment are aligned along each side of the insulating substrate 11. Like the wiring substrate 1 in the second embodiment, as the external electrodes 13 in the example in FIG. 12, the external electrode 13a located at the center of each side of the insulating substrate 11 has a length L1 and a width W1, the external electrodes 13c each have a length L3 and the width W1, the external electrodes 13d each have a length L4 and the width W1, and the external electrodes 13b located at the edges of each side has a length L2 and a width W2. In the example in FIGS. 11 to 13, L1>L3>L4>L2, W1≠W2, Sa>Sc>Sd>Sb are satisfied.

In the wiring substrate 1 in the fourth embodiment, the external electrodes 13 may be configured on two opposed sides of the insulating substrate 11 and on four sides of the insulating substrate 11, that is, the entire outer edge of the insulating substrate 11, in the similar manner to the wiring substrate 1 in the first embodiment or the wiring substrate 1 in the second embodiment.

Also, in the wiring substrate 1 in the fourth embodiment, like the wiring substrate 1 in the first embodiment or the wiring substrate 2 in the second embodiment, the external electrodes 13 may be arranged into a band-shape.

The wiring substrate 1 in the fourth embodiment can be manufactured in the similar manner to the wiring substrates 1 in the above-mentioned embodiments.

The present disclosure is not limited to the above-mentioned embodiments, and may be subjected to various modifications. For example, the insulating substrate 11 may be shaped as a square having a notched portion or chamfered portion on a side surface or corner in plan view. The insulating substrate 11 may be notched from a side surface to the other main surface, and a so-called castellation conductor may be connected to the external electrode 13 and located on the inner surface of the notch. In the present disclosure, such castellation conductor may not be included in the external electrode 13.

In the wiring substrates 1 in the first to fourth embodiments, in a vertical sectional view, the inner wall surface of the recess 12 is located perpendicular to the bottom surface of the recess 12. However, the inner wall surface of the recess 12 may be inclined such that the opening of the recess 12 is wider than the bottom surface of the recess 12. A metal layer may be located on the inner wall surface of the recess 12. For example, when a light-emitting element is used as the electronic component 2, since the metal layer having good reflectivity is located on the inner wall surface of the recess 12, the wiring substrate 1 can be suitably used as the wiring substrate 1 for a light-emitting device having good luminance.

The wiring substrates 1 in the first to fourth embodiments may be combined with each other. For example, in the wiring substrate 1 in the first embodiment, the recess 12 may be circular in plan view.

As in the wiring substrates 1 in the second to fourth embodiments, the width W1 of the external electrode 13a located at the center of each side of the insulating substrate 11 may be equal to the width W2 of the external electrode 13b located at the edge of the side (W1=W2). When the width W1 is equal to the width W2, each of the width of the plurality of external electrodes 13 located along one side of the insulating substrate 11 may be uniform.

In the wiring substrates 1 in the first to fourth embodiments, seven external electrodes 13 are aligned along each side of the insulating substrate 11. The external electrodes 13 located along each side of the insulating substrate 11 may be six or less, or eight or more. The number of the external electrodes 13 on adjacent sides across a corner of the insulating substrate 11 may be varied.

In the above-mentioned embodiments, the insulating substrate 11 is configured of three insulating layers 11a or four insulating layers 11a. However, the insulating substrate 11 may be configured of two or five or more insulating layers 11a. The recess 12 may be a stepped recess 12 in a vertical sectional view.

The wiring substrate 1 may be manufactured as multiple wiring substrates.

In the wiring substrates 1 in the first to third embodiments, another metal layer such as a metal layer for heat radiation may be formed in a center of the lower face of the wiring substrate 1, that is, an area overlapping with the recess 12 in perspective plan view. Such metal layer can be manufactured using the same material and method as the external electrodes 13.

The invention claimed is:
1. A wiring substrate comprising:
an insulating substrate comprising one main surface with a recess, and an other main surface opposite to the one main surface, the insulating substrate being square in plan view of the one main surface; and a plurality of external electrodes located in a row in a peripheral section of the other main surface of the insulating substrate, wherein in plan view of the other main surface, an area of one of the external electrodes located at a center of each side of the insulating substrate is larger than an area of one of the external electrodes located at an edge of the each side, in plan view of the other main surface, the one of the external electrodes located at the edge of the each side of the insulating substrate is larger in length along a direction perpendicular to the each side than the one of the external electrodes located at the center of the each side, and the one of the external electrodes located at the edge of the each side includes a first side along the perpendicular direction in plan view of the other main surface, the one of the external electrodes located at the center of the each side includes a second side parallel to the first side in plan view of the other main surface, and a length of the first side extends beyond a length of the second side.

2. The wiring substrate according to claim 1, wherein the external electrodes are arranged into a band-shape.

3. The wiring substrate according to claim 1, wherein in plan view of the other main surface, areas of the external electrodes become gradually larger from the edge toward the center of the each side of the insulating substrate.

4. The wiring substrate according to claim 1, wherein the recess is square in plan view of the one main surface.

5. The wiring substrate according to claim 1, wherein the recess is circular in plan view of the one main surface.

6. An electronic device comprising:
the wiring substrate according to claim 1; and
an electronic component mounted on the wiring substrate.

7. An electronic module comprising:
a module substrate comprising a connection pad; and
the electronic device according to claim 6 connected to the connection pad via a solder.

8. The wiring substrate according to claim 2, wherein in plan view of the other main surface, areas of the external electrodes become gradually larger from the edge toward the center of the each side of the insulating substrate.

9. The wiring substrate according to claim 2, wherein the recess is square in plan view of the one main surface.

10. The wiring substrate according to claim 3, wherein the recess is square in plan view of the one main surface.

11. The wiring substrate according to claim 8, wherein the recess is square in plan view of the one main surface.

12. The wiring substrate according to claim 2, wherein the recess is circular in plan view of the one main surface.

13. The wiring substrate according to claim 3, wherein the recess is circular in plan view of the one main surface.

14. The wiring substrate according to claim 8, wherein the recess is circular in plan view of the one main surface.

* * * * *